United States Patent [19]
Atsumi et al.

[11] Patent Number: 5,253,201
[45] Date of Patent: Oct. 12, 1993

[54] WRITING CONTROL CIRCUIT EMPLOYED IN NON-VOLATILE SEMICONDUCTOR MEMORY DEVICE

[75] Inventors: Shigeru Atsumi, Tokyo; Hironori Banba, Kawasaki, both of Japan

[73] Assignee: Kabushiki Kaisha Toshiba, Kawasaki, Japan

[21] Appl. No.: 917,953

[22] Filed: Jul. 24, 1992

[30] Foreign Application Priority Data

Jul. 25, 1991 [JP] Japan .................. 3-186440

[51] Int. Cl.⁵ .................. G11C 7/00; G11C 16/06
[52] U.S. Cl. .................. 365/185; 365/189.06; 365/189.07; 365/189.09
[58] Field of Search ......... 365/185, 189.06, 189.07, 365/189.09, 189.11

[56] References Cited

U.S. PATENT DOCUMENTS

| | | | |
|---|---|---|---|
| 5,016,218 | 5/1991 | Yamazaki et al. | 365/189.09 |
| 5,025,417 | 6/1991 | Miyamoto et al. | 365/185 |
| 5,173,874 | 12/1992 | Kobatake | 365/185 |

FOREIGN PATENT DOCUMENTS 2-7297  1/1990  Japan .

Primary Examiner—Eugene R. LaRoche
Assistant Examiner—Andrew Tran
Attorney, Agent, or Firm—Banner, Birch, McKie & Beckett

[57] ABSTRACT

A write control circuit is provided for supplying a gate of an n-channel enhancement-type writing transistor with a voltage corresponding to data when the data is written. The circuit comprises a reference potential-generation circuit, a differential amplifier, and a feedback circuit. The reference potential-generation circuit generates a reference potential substantially equal to the upper limit of that high level of each of the bit lines which is assumed at the time of writing. The differential amplifier has an input terminal to be supplied with the reference potential. A write voltage serving as an operation voltage is applied to the amplifier. The feedback circuit is connected between the other input terminal and output terminal of the differential amplifier. The feedback circuit generates, under the control of the differential amplifier, a write control voltage higher than the reference potential by the threshold voltage of the writing transistor, and applies the write control voltage to the gate of the writing transistor. Also, the feedback circuit feeds a voltage obtained by reducing the write control voltage, back to the other input terminal of the differential amplifier.

14 Claims, 5 Drawing Sheets

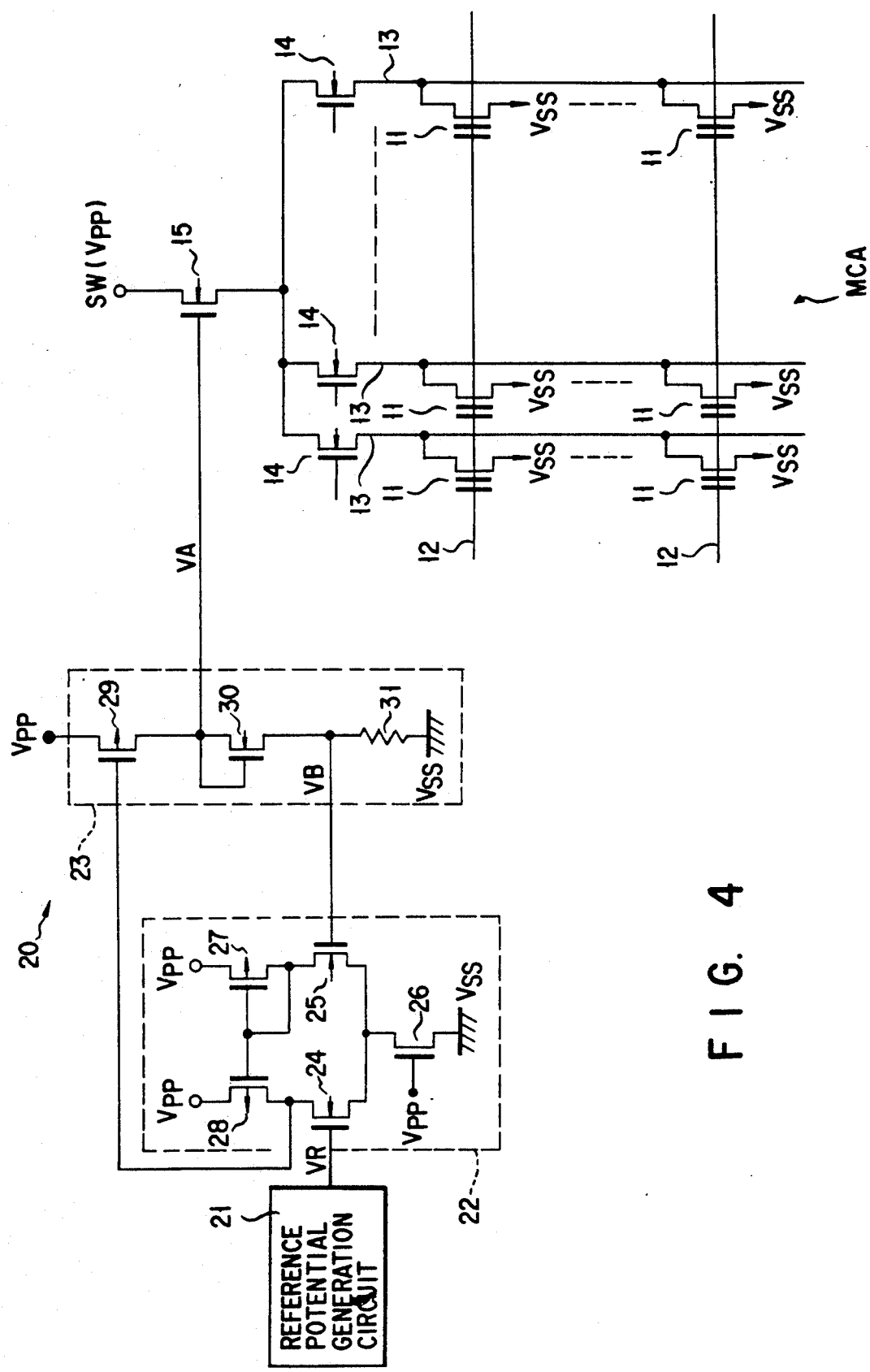
F I G. 4

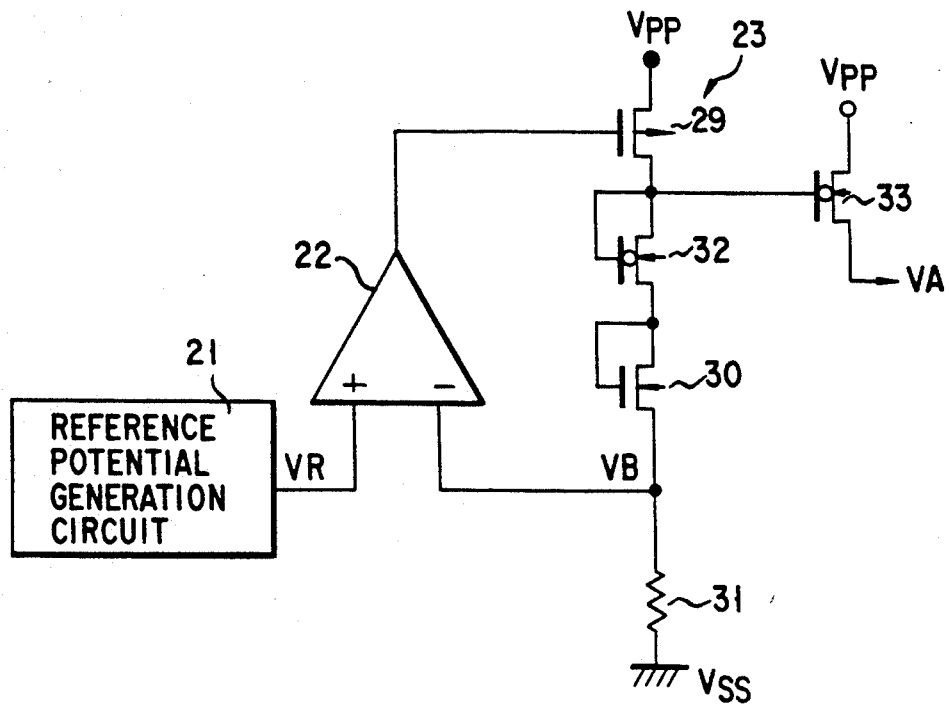
F I G. 5
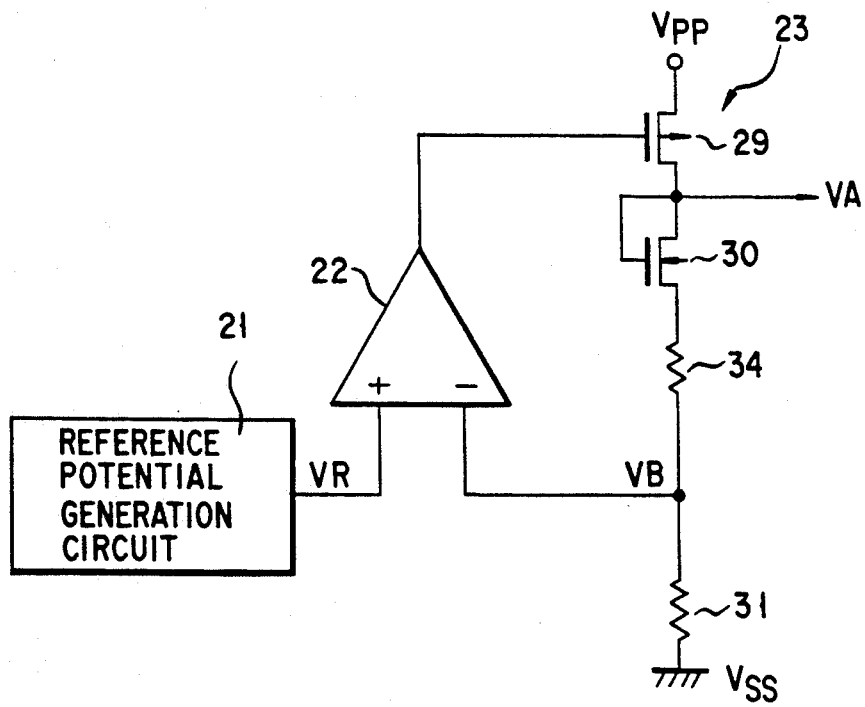
F I G. 6

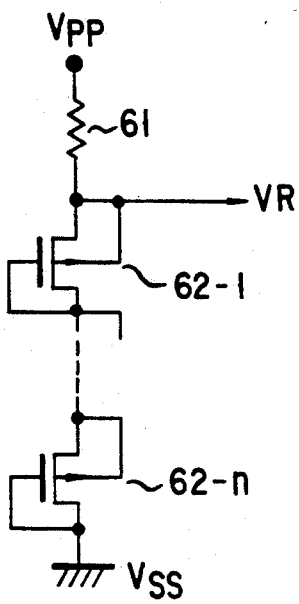
F I G. 9
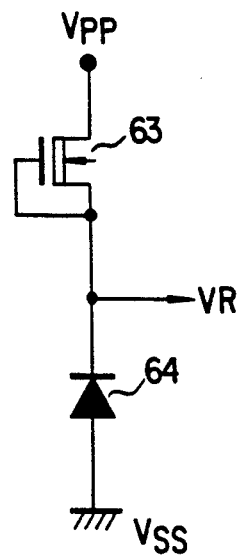
F I G. 10
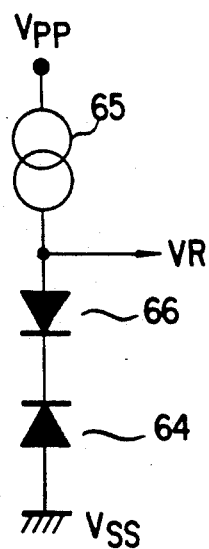
F I G. 11
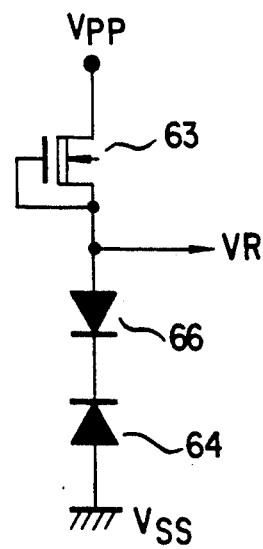
F I G. 12

WRITING CONTROL CIRCUIT EMPLOYED IN NON-VOLATILE SEMICONDUCTOR MEMORY DEVICE

BACKGROUND OF THE INVENTION

1. Field of the Invention

This invention relates to a non-volatile semiconductor memory device, which has a memory array consisting of non-volatile memory cells arranged in rows and columns and having a stacked gate structure, and more particularly to a writing control circuit for controlling a writing transistor used to writing data into the memory cells.

2. Description of the Related Art

EPROMs (Erasable Programmable Read Only Memories) and EEPROMs (Electrical Erasable Programmable Read Only Memories) each employ MOS transistors having a stacked gate structure and serving as memory cells. Writing data into the memory cells is performed by injecting hot electrons from the drain of the cell into the floating gate thereof. An EPROM with Tunnel Oxide called an "ETOX" (a trademark of the US company of Intel Corporation) type cell is one of such EPROM cells.

A non-volatile memory cell of this type generally has a structure as shown in FIG. 1. As is shown in the figure, second conductivity-type source and drain regions 72 and 73 are formed separate from each other in a major surface portion of a first conductivity-type semiconductor substrate 71. A first gate insulation film (tunnel insulation film) 74 is formed on the substrate 71 between the source and drain regions 72 and 73. A floating gate 75, a second gate insulation film 77, and a control gate 76 are formed on the first gate insulation 74 in the order mentioned.

At the time of writing data into the memory cell (i.e., at the time of programming), a low voltage (e.g. of 0 V) is applied to the cell as the source voltage VS and substrate potential, while a high voltage Vpp for writing is applied to the same as the control gate voltage VCG and drain voltage VD. The high voltage Vpp is supplied from the outside of the memory device, or alternatively a voltage, obtained by increasing a power supply voltage for the memory device in the same, is used as the high voltage Vpp. As a result, an on-current flows between the drain and source, giving rise to pairs of hot electrons and hot holes in the vicinity of the drain region 73. The hot holes flow through the substrate 71 as a substrate current, while the hot electrons are injected into the floating gate 75 via the first insulation film 74. Thus, the threshold voltage of the transistor is increased, which is termination of writing.

In a case where the memory cell is an ETOX type cell, erasion of data is performed by supplying the high voltage Vpp and low voltage (0 V) as the source voltage VS and control gate voltage VCG, respectively, and causing the drain region 73 to be in a floating state. In this case, the potential VFG of the floating gate 75 is determined based on the ratio of the capacity between the control gate 76 and floating gate 75 to the capacity between the floating gate 75 and source region 72 is determined, and on the source voltage VS. Application of the above-described voltages causes a Fowler-Nordheim tunnel current to flow between the source region 72 and floating gate 75, thus eliminating the electrons from the floating gate 75 and terminating erasion (i.e., the threshold voltage returns to a value having assumed before writing).

In the memory cell array consisting of the above-described memory cells arranged in rows and columns, there exist a plurality of non-selected memory cells, which are connected to each selected memory cell by means of a corresponding common bit or word line. These non-selected memory cells may cause the following problems at the time of writing:

To write data into a selected memory cell, the drain and gate of each of non-selected memory cells which are connected to the selected memory cell via a common bit line are supplied with the high voltage Vpp and a ground potential Vss, respectively. At this time, an intense electric field is caused between the drain and floating gate of the non-selected cell. In particular, where the non-selected cell is in its writing state, and hence electrons are accumulated at the floating gate, the electric field between the drain and floating gate may be highly concentrated, resulting in a breakdown in a junction between the drain region and substrate, or the electrons at the floating gate may flow into the drain region through the tunnel insulation film. This being so, the reliability of the memory cell may be reduced. Thus, it is necessary, at the time of writing, to keep the drain voltage at a low level enough to obtain satisfactory writing characteristics without reducing the reliability of the memory cell.

Further, with the development of the refining technique for semiconductor devices, it has been necessary to reduce the thickness of a gate insulation film and to increase the concentration of an impurity contained in a channel region. This may cause a reduction in the breakdown voltage of a pn-junction or an increase in an electric field applied onto the gate insulation film. The finer the device, the more important to reliably and accurately control the upper limit of the drain voltage at the time of writing.

FIG. 2 is a schematic equivalent circuit diagram, useful in explaining a writing system employed in an EPROM or EEPROM, and showing a memory cell 81, a column-selecting transistor 84, a writing transistor 85, and a write control circuit 90. The memory cell 81 has its control gate connected to a word line 82, its drain connected to a bit line 83, and its source connected to a ground terminal Vss. An end of the bit lien 83 is connected to an end of the current path of the column-selecting transistor 84. The transistor 84 is of the n-channel enhancement type. The current path of the writing transistor 85 is connected between the other end of the current path of the transistor 84 and a power supply SW in the memory. The transistor 85 is of the n-channel enhancement type. The power supply SW supplies a high voltage Vpp (e.g., 12.5 V) at the time of writing data into the memory cell. The gate of the writing transistor 85 is connected to a write control circuit 90. The word line 82 and the gate of the column-selecting transistor 84 are connected to the output terminals of a row decoder and a column decoder (not shown), respectively. In accordance with the output of the row decoder, the high voltage Vpp is applied to the word line 82 when the line is selected, and the ground potential Vss when it is not selected. Further, in accordance with the output of the column decoder, the high voltage Vpp is applied to the gate of the column-selecting transistor 84 when the transistor is selected, and the ground potential Vss when it is not selected. A write control voltage VA or the ground potential Vss is applied to the gate of the writing transistor 85 in accordance with whether write input data from the write control circuit 90 is at "H" level or "L" level. The "H" level of the bit line 83 is $VA - V_{THN}$ ($V_{THN}$ represents the threshold voltage of the n-channel enhancement-type transistor 85), so that the drain voltage of the memory cell 81 is determined by the write control voltage VA.

FIG. 3 is a circuit diagram, showing a circuit for generating the write control voltage VA, which is provided in the write control circuit 90 shown in FIG. 2. The circuit 90 comprises an n-channel enhancement-type transistor 91, a p-channel enhancement-type transistor 92, and an n-channel depletion-type transistor 93. The current paths of the transistors 91 to 93 are connected in series to one another between the high voltage power supply Vpp and ground terminal Vss. In the transistor 91, the gate is connected to the drain. In the transistor 92, the gate is connected to a power supply Vcc, and the back gate is connected to the source. Further, in the transistor 93, the gate is connected to the source. The conductance gm of the transistor 93 is set smaller than that of the transistor 91. Thus, when the write data is at "H" level, the write control voltage $VA = Vpp - V_{THN}$ ($V_{THN}$ represents the threshold voltage of the transistor 91) is output from the source of the transistor 91. Accordingly, the "H" level of the bit line 83 is $VA - V_{THN} = Vpp - 2V_{THN}$.

In the above-described structure, however, the write control voltage VA is created by reducing the high voltage Vpp by the threshold voltage $V_{THN}$ of the transistor 91, so that the degree of dependence of the write control voltage VA upon Vpp and $V_{THN}$ is high, which may cause the upper limit of the drain voltage of the memory cell to be unstable. In particular, the threshold voltage $V_{THN}$ is assumed when the transistor 91 receives a substrate bias of not less than 5 V, and is as much as 2 V or more. In addition, the transistor 91 is greatly influenced by the substrate bias, and highly depends upon the dose of impurity ions used at the time of channel ion implantation for controlling the threshold voltage. As a result, the threshold voltage $V_{THN}$ greatly varies, and hence it is difficult to accurately control the upper limit of the drain voltage of the memory cell at the time of writing data into the cell.

SUMMARY OF THE INVENTION

It is the object of the invention to provide a non-volatile semiconductor device incorporating a write control circuit capable of stably and accurately controlling the upper limit of the drain voltage of the memory cell at the time of writing data therein.

To attain the above object, the non-volatile semiconductor device of the invention comprises: a memory cell array having non-volatile memory cells arranged in rows and columns, each memory cell having a control gate, a gloating gate, a source, and a drain; word lines each connected to the control gates of those memory cells of the memory cell array which are arranged in the same row; bit lines being perpendicular to the word lines, and each connected to the drains of those memory cells of the memory cell array which are arranged in the same column; column-selecting transistors each having a current path, which has one end thereof connected to a corresponding one of the bit lines and the other end thereof connected in common to one another; an n-channel enhancement-type writing transistor having a current path, which has an end thereof connected to the other end of each of the column-selecting transistors, and the other end thereof connected to a writing voltage source; and a write control circuit for supplying the gate of the writing transistor with a voltage corresponding to data when the data is written, the write control circuit having reference potential-generation circuit for generating a reference potential substantially equal to the upper limit of that high level of each of the bit lines which is assumed at the time of writing, differential amplifier to be supplied from the writing voltage source with a writing-voltage serving as an operational voltage, the differential amplifier having an input terminal to be supplied with the reference potential from the reference potential-generation circuit, and feedback circuit connected between the other input terminal and output terminal of the differential amplifier, the feedback circuit generating, under the control of the differential amplifier, a write control voltage higher than the reference potential by the threshold voltage of the n-channel enhancement-type writing transistor, and applying the write control voltage to the gate of the writing transistor, the feedback circuit feeding a voltage obtained by reducing the write control voltage, back to the other input terminal of the differential amplifier.

In the above-described structure, when write data of high level is written into the memory cell, the gate of the writing transistor receives a write control voltage higher, by the threshold voltage of the n-channel enhancement-type transistor, than a voltage substantially equal to the upper limit of the high level of the bit line. As a result, the upper limit of the high level of the bit line can stably and accurately be controlled to a voltage lower than the write control voltage by the threshold voltage of the writing transistor, i.e., to the reference potential.

In summary, the invention can provide a nonvolatile semiconductor device incorporating a write control circuit capable of stably and accurately controlling the upper limit of the drain voltage of the memory cell at the time of writing data therein.

BRIEF DESCRIPTION OF THE DRAWINGS

FIG. 4 is a schematic circuit diagram, useful in explaining a non-volatile semiconductor memory device according to an embodiment of the invention, and showing part of a memory cell array and its peripheral circuit in the EPROM, and a circuit provided in the write control circuit for generating a write control voltage;

FIGS. 5 and 6 are circuit diagrams, showing modifications of the circuit shown in FIG. 4;

FIGS. 8 to 12 are circuit diagrams, showing modifications of the reference voltage generation circuit.

DETAILED DESCRIPTION OF THE PREFERRED EMBODIMENTS

Figure 1:
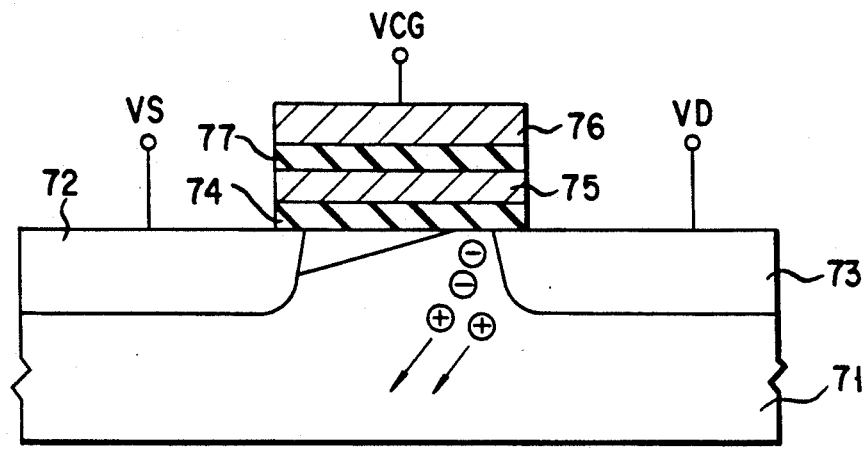
FIG. 1 is a cross sectional view, useful in explaining a conventional non-volatile semiconductor memory device, and showing a non-volatile memory cell employed therein and having a stacked gate structure.
Figure 2:
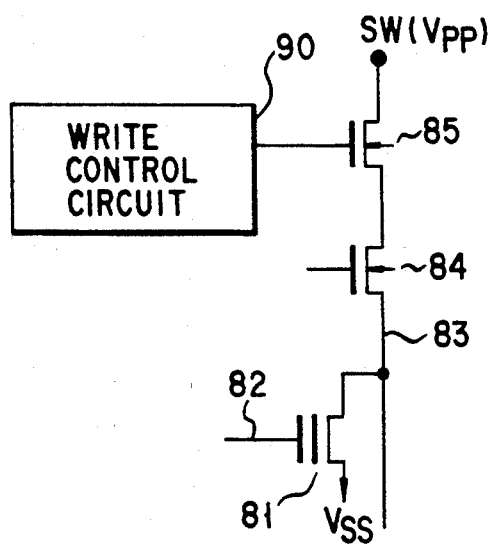
FIG. 2 is a schematic equivalent circuit diagram, showing a data-writing system employed in an EPROM or EEPROM.
Figure 3:
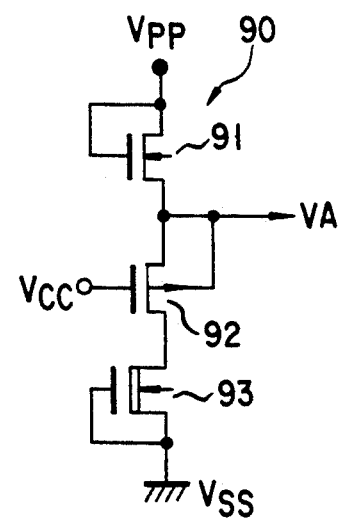
FIG. 3 is a schematic circuit diagram, showing a circuit for generating a write control voltage, which is provided in a write control circuit employed in the circuit shown in FIG. 2.

FIG. 4 is a circuit diagram, useful in explaining a non-volatile semiconductor memory device according to an embodiment of the invention. In the figure, part of a memory cell array and its peripheral circuit in the EPROM, and a circuit provided in the write control circuit for generating a write control voltage are shown schematically. Memory cells 11 having a stacked gate structure are arranged in rows and columns, thus forming a memory cell array MCA. The source of each of the memory cells 11 is connected to e.g. a ground terminal Vss. Each of word lines 12 is connected to the control gates of the memory cells 11 arranged in a corresponding one of the rows of the array MCA. The word lines 12 are supplied with output signals from a row decoder (not shown). Each of bit lines 13 is connected to the drains of the memory cells 11 arranged in a corresponding one of the columns of the array MCA, i.e., the bit lines 13 are arranged perpendicular to the word lines 12. N-channel enhancement-type column-selecting transistors 14 have their sources connected to the bit lines 13, their drains connected to one another, and their gates supplied with output signals from a column decoder (not shown). The output signal supplied to the gate of each transistor 14 is at "H" level or "L" level in accordance with whether the transistor 14 is selected or not selected. The "L" level is specifically 0 V, while the "H" level is specifically a high voltage Vpp (e.g. 12.5 V) at the time of writing, and a power supply voltage Vcc at the time of reading. An n-channel enhancement-type writing transistor 15 has its source connected to a common connection node of the drains of the transistors 14, and its drain connected to an internal power supply SW for writing. The power supply SW supplies the high voltage Vpp at the time of writing.

The gate of the writing transistor 15 is supplied from a write control circuit 20 with a write control voltage VA or a ground potential Vss in accordance with whether write input data is at "H" level or "L" level. In the write control circuit 20 of FIG. 4, only a circuit for supplying the write control voltage VA is shown, and a circuit for supplying the ground potential Vss is not shown. The circuit 20 includes a reference-potential generation circuit 21, a differential amplifier 22, and a feedback circuit 23. The circuit 21 generates a reference potential VR substantially equal to the upper limit value of the "H" level of the bit line created at the time of writing. The amplifier 22, which needs the high voltage Vpp to use it as an operational voltage, may be of the current-mirror-load type, the flip-flop type, or the like. In this embodiment, a CMOS differential amplifier of the current-mirror-load type is used. The amplifier 22 comprises n-channel enhancement-type transistors 24 and 25 having difference inputs, an n-channel enhancement-type transistor 26 serving as a constant current source, and p-channel enhancement-type transistors 27 and 28 serving as loads. The load transistors 27 and 28 have their sources connected to a high voltage power supply Vpp (or a corresponding high voltage node). The constant current source transistor 26 has its source connected to the ground terminal Vss, and its gate connected to the high voltage power supply Vpp. The reference potential VR is supplied from the reference-potential generation circuit 21 to the gate of the transistor 24. A voltage VB is supplied from the feedback circuit 23 to the gate of the transistor 25. An output signal is generated from the junction of the current paths of the transistors 24 and 28.

The feedback circuit 23 supplies the gate of the transistor 15 with the write control voltage VA higher than the reference potential VR by the threshold voltage $V_{THN}$ of the n-channel enhancement-type transistor. The circuit 23 feeds back to the differential amplifier 22 a voltage VB lower than the write control voltage VA by the threshold voltage $V_{THN}$. The feedback circuit 23 comprises a p-channel enhancement-type transistor 29, an n-channel enhancement-type transistor 30, and a resistor 31 having a high resistance. The transistor 29 has its source connected to the high voltage power supply Vpp (or a corresponding high voltage node), and its gate connected to the output terminal (i.e. the junction of the current paths of the transistors 24 and 28) of the differential amplifier 22. The drain and gate of the transistor 30 are connected to the source of the transistor 29. The resistor 31 has an end connected to the source of the transistor 30, and the other end connected to the ground terminal Vss. The connection node between the source of the transistor 30 and resistor 31 is connected to the gate of the transistor 25, thereby feeding the voltage VB back to the differential amplifier 22. The write control voltage VA is output from the drains of the transistors 29 and 30, and supplied to the gate of the transistor 15. Accordingly, when the threshold voltage of the transistor 30 is $V_{THN}$, the equation $VA = VB + V_{THN}$ is satisfied.

The operation of the write control circuit 20 now will be explained. The differential amplifier 22 outputs a signal of "L" level when $VR > VB$, and outputs a signal of "H" level when $VR < VB$. The transistor 29 is turned on when the input to the gate thereof is of "L" level, and turned off when it is of "H" level. When the transistor 29 is in the on-state, the voltages VA and VB are pulled up, whereas when it is the off-state, they are pulled down. Thus, feedback control is performed so as to cause VB to be equal to VR. Since the amount of current flowing through the resistor 31 is a little, if the channel width W of the transistor 30 is large, $VA = VR + V_{THN}$ is satisfied and hence the circuit 20 can operate in a stable manner.

Then, the write mode of the above-described EPROM will be explained.

When data to be written is at "H" level, the write control circuit 20 outputs a write control voltage "$VA = VR + V_{THN}$". The bit line 13 of a column including a selected memory cell 11 will accordingly be at an "H" level of VR ($= VR + V_{THN} - V_{THN}$). Thus, writing will be performed in the above-described manner by applying the high voltage Vpp to the word line 12 of a row including the selected memory cell 11.

In the above structure, when data to be written is at "H" level, the write control voltage VA higher, by the threshold voltage of the n-channel enhancement-type transistor, than the reference potential VR substantially equal to the "H" level of the bit line 13 is applied to the gate of the writing transistor 15. Therefore, the upper limit of the "H" level of the bit line 13 is stably and accurately controlled to a voltage lower than the write control voltage VA by the threshold voltage $V_{THN}$ of the writing transistor 15, i.e., controlled to the reference potential VR.

FIG. 5 shows a modification of the write control circuit 20 shown in FIG. 4. In FIG. 5, the differential amplifier 22 is represented by a circuit symbol.

This write control circuit is similar to that shown in FIG. 4 except that n-channel intrinsic-type transistors 32 and 33 having a threshold voltage of 0 V are incorporated in the feedback circuit 23. The transistor 32 has its drain and gate connected to the drain of the transistor 29, and its source connected to the drain and gate of the transistor 30. The transistor 33 has its drain connected to the high voltage power supply Vpp (or a corresponding high voltage node), and its gate connected to the drains of the transistors 29 and 32. The write control voltage VA is output from the source of the transistor 33.

Though the circuit shown in FIG. 5 operates in a manner similar to that of the circuit shown in FIG. 4, it has the following advantages: In the circuit of FIG. 4, the write control voltage VA may fluctuate at the time of change of data, whereas in the circuit of FIG. 5, even if the write control voltage fluctuates, no feedback loop is formed since the voltage is supplied from the source of the transistor 33 having a source follower connection structure. Thus, fluctuation of the voltage VA is not liable to occur. However, even in the circuit of FIG. 4, the fluctuation can be prevented by making the channel length and/or width of each transistor have optimal sizes.

FIG. 6 shows another modification of the write control circuit 20 of FIG. 4. Also in FIG. 6, the differential amplifier 22 is represented by a circuit symbol.

The write control circuit of FIG. 6 is similar to that of FIG. 4 except that a resistor 34 is added in the feedback circuit 23. The resistor 34 is connected between the source of the transistor 30 and an end of the resistor 31, and the voltage VB is fed back to the other input terminal (inverted input terminal) of the differential amplifier 22 from the junction of the resistors 34 and 31.

In the above structure, feedback control is performed so that the ratio $\beta$ of divided voltages obtained using the resistors 31 and 34 could be expressed by the equation "$VB/\beta = VR$". As a result, the level of the voltage VB can be adjusted with ease, thereby enhancing the controllability of the write control circuit 20.

Figure 7:
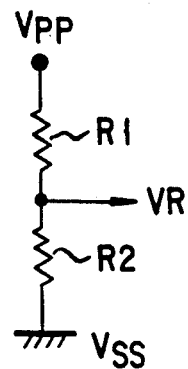
FIG. 7 is a circuit diagram, showing a reference voltage generation circuit employed in the circuits shown in FIGS. 4 to 6.

FIG. 7 shows the reference potential-generation circuit 21 employed in the circuits shown in FIGS. 4 to 6.

This circuit is a resistance type potential divider having a plurality of resistors (R1 and R2 in the embodiment) connected in series between the high voltage power supply Vpp (or a corresponding high voltage node) and ground terminal Vss. A divided potential at the connection node of the resistors R1 and R2, i.e., $Vpp \times R2(R1+R2)$, is output as the reference potential VR. A change $\Delta VR$ in the potential VR corresponding to a change $\Delta Vpp$ in the high voltage Vpp is $\Delta Vpp \times R2/(R1+R2)$. Accordingly, when $\Delta Vpp = 12.5$ V and $VR = 6$ V, $\Delta VR$ is approx. $\frac{1}{2}$ of $\Delta Vpp$.

Figure 8:
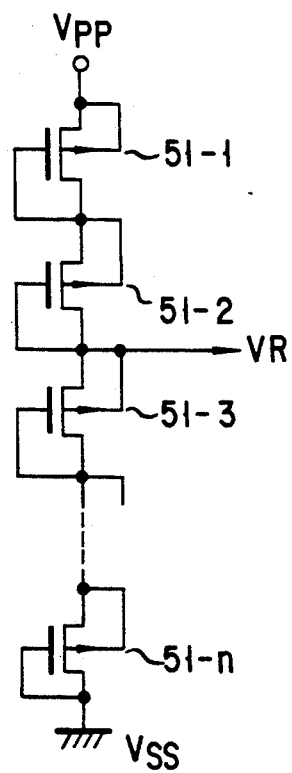

FIG. 8 shows a modification of the reference potential-generation circuit 21 employed in the circuits shown in FIGS. 4 to 6.

This circuit is a potential divider which is provided with n (n is an integer not less than 2) p-channel enhancement-type transistors 51-1, 51-2, ..., 51-n provided between the high voltage power supply Vpp and ground terminal Vss and having their current paths connected in series to one another. Each of the transistors has a diode connection structure (that is, the source and back gate thereof are connected to each other, and the gate and drain thereof are connected to each other). A divided potential at the connection node of a selected one of the transistors 51-1, 51-2, ..., 51-n is used as the reference potential VR. N-channel enhancement-type transistors may be used as those transistors.

FIG. 9 shows a further modification of the reference potential-generation circuit 21 shown in FIGS. 4 to 6. In this circuit, a resistor 61 having a high resistance, and n (n is an integer not less than 1) p-channel enhancement-type transistors 62-1, ..., 62-n are connected between the high voltage power supply Vpp and ground terminal Vss. These transistors have current paths thereof connected in series to one another, and each have a diode connection structure. The potential of a connection node between the resistor 61 and transistor 61-1, i.e., $n \times |V_{THP}|$ ($V_{THP}$ is the threshold voltage of the p-channel transistor), is output as the reference potential VR.

The circuits shown in FIGS. 8 and 9 employ the transistors 51-1, 51-2, ..., 51-n, and 61-1, 61-2, ..., 61-n which have no substrate bias effect. In order to accurately control the reference potential VR, it is preferable to use, as those transistors, p-channel transistors in which channel ion implantation for threshold voltage control is not effected, since they have substantially the same threshold voltage.

FIGS. 10 to 12 show other modifications of the above reference potential-generation circuit 21. In these circuits, diodes are employed. In the circuit shown in FIG. 10, the circuit 21 consists of an n-channel depletion-type transistor 63 and a diode 64. The transistor 63 has its drain connected to the high voltage power supply Vpp (or a corresponding high voltage node), and its gate and source connected to the cathode of the diode 64. The anode of the diode 64 is connected to the ground terminal Vss. The potential of a connection node between the transistor 63 and diode 64 is output as the reference potential VR. In the circuit of FIG. 11, the reference potential-generation circuit 21 consists of a constant-current source 65 and diodes 66 and 64. The source 65 has an end connected to the high voltage power supply Vpp, and the other end connected to the anode of the diode 66. The cathode of the diode 66 is connected to the cathode of the diode 64, and the anode of the diode 64 is connected to the ground terminal Vss. The reference potential VR is output from a connection node between the constant-current source 65 and diode 66. In the circuit of FIG. 12, the n-channel depletion-type transistor 63 is used in place of the constant-current source 65 employed in the circuit of FIG. 11.

Even the circuits shown in FIGS. 10 to 12 can provide an effect similar to those of the circuits shown in FIGS. 7 to 9. Further, connecting the diodes 66 and 64 as shown in FIGS. 11 and 12 can offset the temperature-depending characteristics of the pn junctions of the diodes 66 and 64, thereby making constant the output potential VR irrespective of temperature.

The invention is not limited to the above-described embodiments, but may be modified in various manners. It is generally applicable to EPROMs and EEPROMs.

What is claimed is:

1. A non-volatile semiconductor memory device comprising:
    a memory cell array having non-volatile memory cells arranged in rows and columns, each memory cell having a control gate, a floating gate, a source, and a drain;
    word lines each connected to the control gates of those memory cells of the memory cell array which are arranged in the same row;

bit lines being perpendicular to the word lines, and each connected to the drains of those memory cells of the memory cell array which are arranged in the same column;

column-selecting transistors each having a current path, which has one end connected to a corresponding one of the bit lines and the other end connected in common to one another;

an n-channel enhancement-type writing transistor having a current path, which has an end thereof connected to the other end of each of the column-selecting transistors, and the other end thereof connected to a writing voltage source; and a write control circuit for supplying the gate of the writing transistor with a voltage corresponding to data when the data is written, the write control circuit having reference potential-generation means for generating a reference potential, differential amplifier means to be supplied with a write voltage serving as an operation voltage, from the writing voltage source, the differential amplifier means having an input terminal to be supplied with the reference potential from the reference potential-generation means, and feedback means connected between the other input terminal and output terminal of the differential amplifier means, the feedback means generating, under the control of the differential amplifier means, a write control voltage higher than the reference potential by the threshold voltage of the n-channel enhancement-type writing transistor, and applying the write control voltage to the gate of the n-channel enhancement-type writing transistor, the feedback means feeding a voltage obtained by reducing the write control voltage, back to the other input terminal of the differential amplifier means.

2. The non-volatile semiconductor memory device according to claim 1, wherein the reference potential-generation means has a plurality of load elements connected in series between the writing voltage source and a ground terminal, the reference potential-generation means outputting the reference potential from a connection node between the load elements.

3. The non-volatile semiconductor memory device according to claim 2, wherein each of the load elements includes a resistor.

4. The non-volatile semiconductor memory device according to claim 2, wherein each of the load elements includes a transistor having a diode connection structure.

5. The non-volatile semiconductor memory device according to claim 4, wherein the transistor is of an enhancement type, and has a source connected to a back gate, and a gate connected to a drain thereof.

6. The non-volatile semiconductor memory device according to claim 2, wherein the load elements include a resistor and a transistor having a diode connection structure.

7. The non-volatile semiconductor memory device according to claim 6, wherein the transistor is of an enhancement type, and has a source connected to a back gate, and a gate connected to a drain.

8. The non-volatile semiconductor memory device according to claim 1, wherein the reference potential generation-means has a constant-current source having an end connected to the writing voltage source, and a first diode having a cathode connected to the other end of the constant-current source, and an anode connected to a ground terminal, the reference potential being output from a connection node between the other end of the constant-current source and the cathode of the first diode.

9. The non-volatile semiconductor memory device according to claim 8, wherein the constant-current source includes a depletion-type transistor having a drain connected to the writing voltage source, a gate and a source connected to the cathode of the first diode.

10. The non-volatile semiconductor memory device according to claim 8, further comprising a second diode having an anode connected to the other end of the constant-current source, and a cathode connected to the cathode of the first diode.

11. The non-volatile semiconductor memory device according to claim 1, wherein the differential amplifier means includes a current-mirror-load type CMOS differential amplifier circuit.

12. The non-volatile semiconductor memory device according to claim 1, wherein the feedback means is provided with a p-channel enhancement-type transistor having a source connected to the writing voltage source, and a gate to be supplied with an output potential from the differential amplifier means; an n-channel enhancement-type transistor having a gate and a drain connected to the drain of the p-channel enhancement-type transistor; and a first resistor connected between the source of the n-channel enhancement-type transistor and a ground terminal, a junction between the drain of the p-channel enhancement-type transistor and the drain of the n-channel enhancement-type transistor being connected to the gate of the n-channel enhancement-type writing transistor, and a junction between the source of the n-channel enhancement-type transistor and the first resistor being connected to the other input terminal of the differential amplifier means.

13. The non-volatile semiconductor memory device according to claim 12, further comprising a second resistor connected between the source of the n-channel enhancement-type transistor and the first resistor, and wherein a junction between the first resistor and second resistor is connected to the other input terminal of the differential amplifier means.

14. The non-volatile semiconductor memory device according to claim 12, further comprising a first n-channel intrinsic-type transistor having a drain and a gate connected to the drain of the p-channel enhancement-type transistor, and a source connected to the drain and gate of the n-channel enhancement-type transistor; and a second n-channel intrinsic-type transistor having a drain connected to the writing voltage source, and a gate connected to a junction between the drain of the p-channel enhancement-type transistor and the drain of the first n-channel intrinsic-type transistor, the source of the second n-channel intrinsic-type transistor being connected to the gate of the n-channel enhancement-type writing transistor.

* * * * *